(12) United States Patent
Eldring et al.

(10) Patent No.: US 6,960,032 B2
(45) Date of Patent: Nov. 1, 2005

(54) METHOD FOR MAKING HERMETICALLY SEALED TRANSMITTER OPTICAL SUBASSEMBLY

(75) Inventors: Joachim Eldring, Louisville, CO (US); Blake Mynatt, Broomfield, CO (US); Kevin Malone, Boulder, CO (US); Rich Adams, Boulder, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 10/812,554

(22) Filed: Mar. 30, 2004

(65) Prior Publication Data

US 2004/0228588 A1    Nov. 18, 2004

Related U.S. Application Data

(62) Division of application No. 10/152,701, filed on May 22, 2002, now Pat. No. 6,757,308.

(51) Int. Cl.[7] ............................. G02B 6/36; G02B 6/30
(52) U.S. Cl. ............................. 385/93; 385/49; 385/52; 385/91; 385/92
(58) Field of Search ............................. 385/15, 49, 52, 385/88–94

(56) References Cited

U.S. PATENT DOCUMENTS

| | | | | |
|---|---|---|---|---|
| 5,185,846 A | * | 2/1993 | Basavanhally et al. | 385/137 |
| 5,281,301 A | * | 1/1994 | Basavanhally | 216/24 |
| 6,056,448 A | * | 5/2000 | Sauter et al. | 385/92 |
| 6,318,909 B1 | * | 11/2001 | Giboney et al. | 385/90 |
| 6,450,704 B1 | * | 9/2002 | O'Connor et al. | 385/92 |
| 6,616,345 B2 | * | 9/2003 | von Freyhold et al. | 385/90 |
| 6,736,553 B1 | * | 5/2004 | Stiehl et al. | 385/89 |
| 6,757,308 B1 | | 6/2004 | Eldring et al. | 372/36 |
| 2003/0091302 A1 | * | 5/2003 | Giboney et al. | 385/92 |

* cited by examiner

Primary Examiner—Akm Enayet Ullah
Assistant Examiner—Daniel Petkovsek
(74) Attorney, Agent, or Firm—Barlow, Josephs & Holmes, Ltd.

(57) ABSTRACT

A method for making a transmitter optical subassembly (TOSA) is provided. In the method, an alignment in the Z-direction between a fiber stub array (FSA) and a VCSEL array is performed first. Then, an alignment in the X-Y direction is performed. A rough prealignment in the X-Y direction may also be performed prior to the alignment in Z-direction. A vertical cavity surface emitting laser (VCSEL) array may be hermetically sealed using a lens assembly or by using a separate lid assembly. The hermetic sealing and attaching of different components may be achieved by laser welding and/or soldering or any other suitable method.

9 Claims, 9 Drawing Sheets

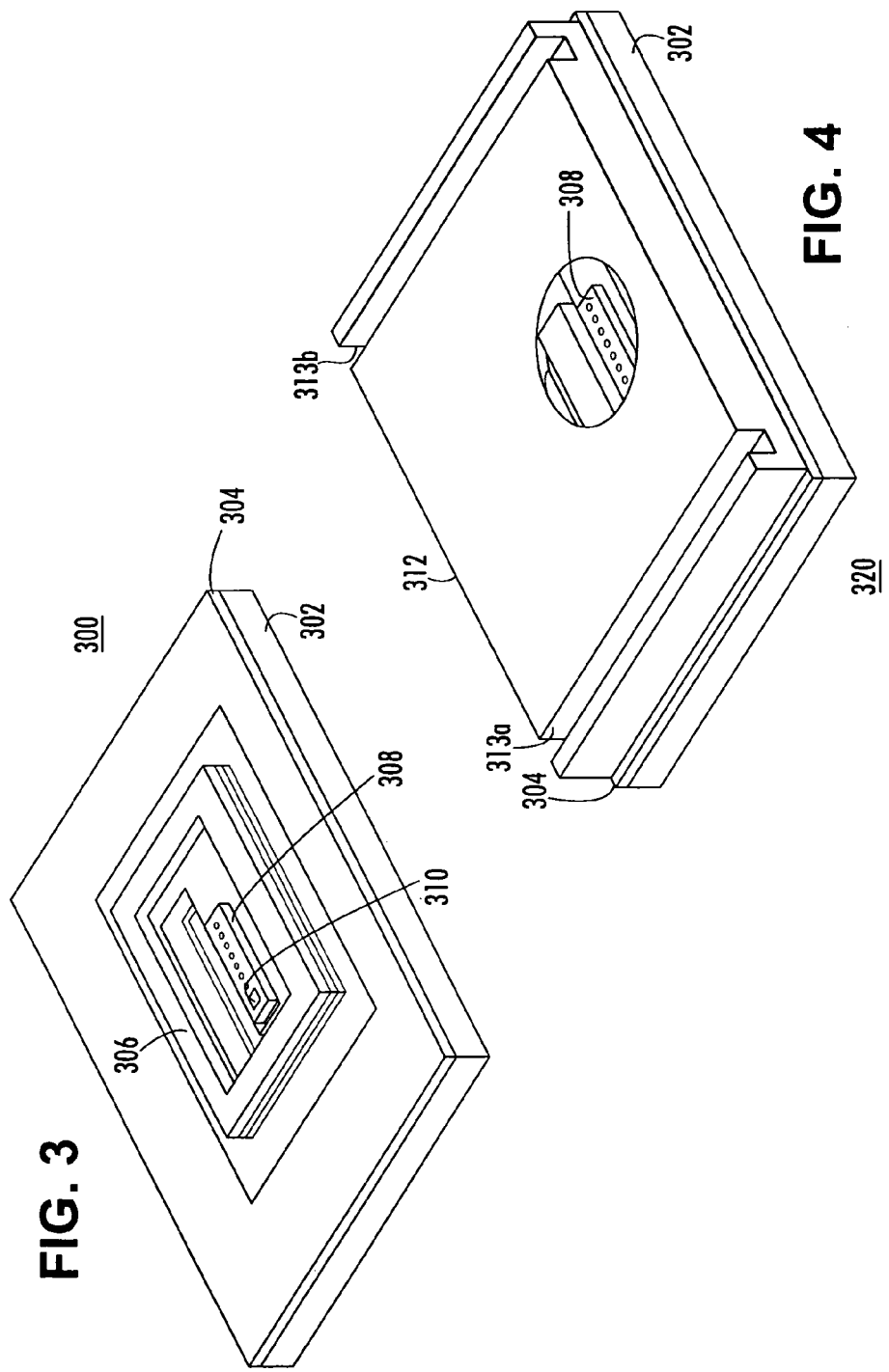

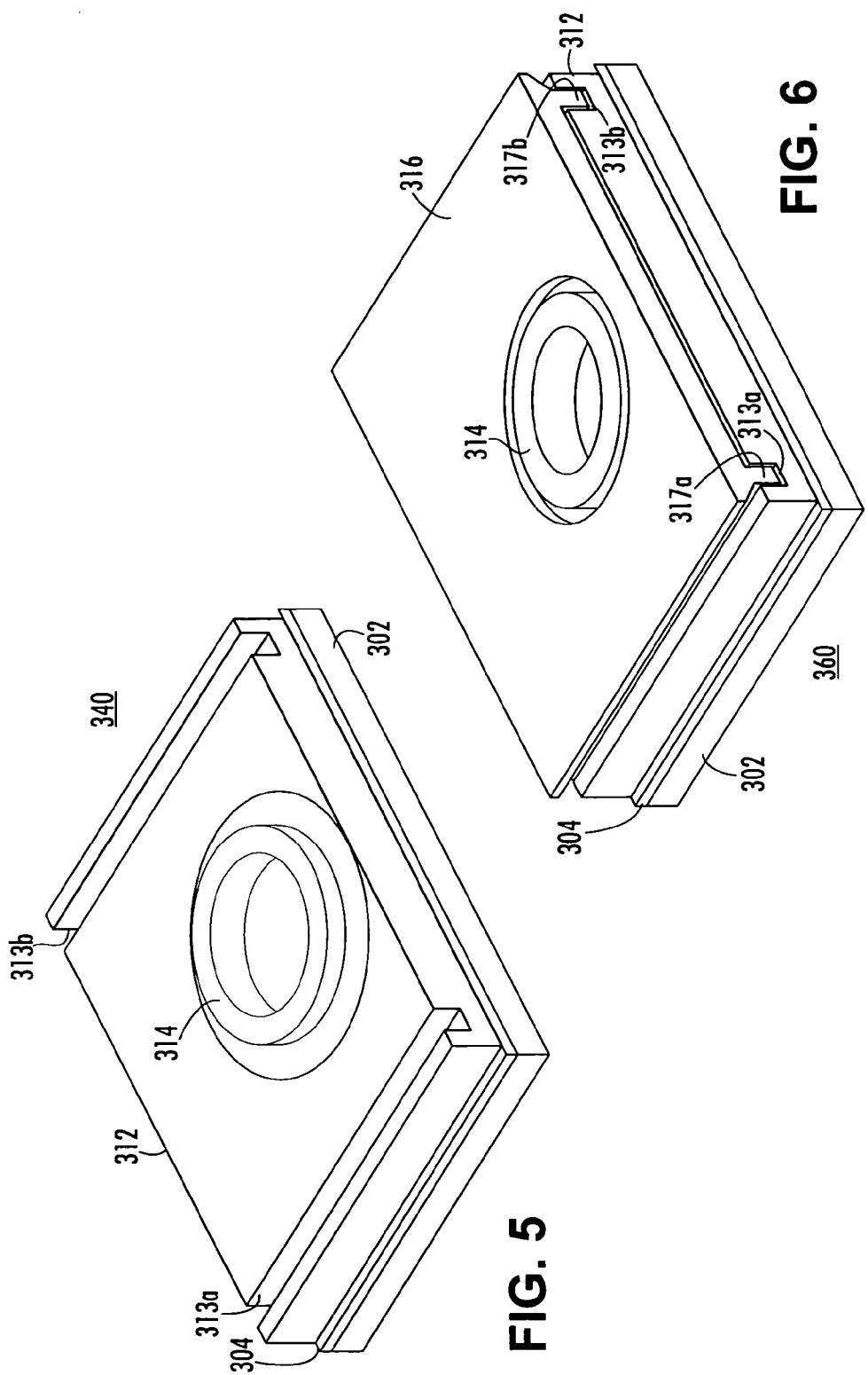

US 6,960,032 B2

METHOD FOR MAKING HERMETICALLY SEALED TRANSMITTER OPTICAL SUBASSEMBLY

CROSS-REFERENCE TO RELATED APPLICATIONS

This application is a divisional of U.S. patent application Ser. No. 10/152,701 having a filing date of May 22, 2002 which is now U.S. Pat. No. 6,757,308, the entire contents of which are hereby incorporated by reference.

FIELD OF THE INVENTION

The present invention relates to an optical subassembly, and particularly to a hermetically sealed optical subassembly, and a method of assembling the same.

BACKGROUND OF THE INVENTION

In an optical communication system, components on the transmission side are typically packaged in a transmitter optical subassembly (TOSA). While assembling a TOSA, optical transmitting elements (e.g., vertical cavity surface emitting lasers (VCSELs)) are aligned with optical fibers so as to provide sufficient coupling efficiency. The optical transmitting elements and the optical fibers may also need to be aligned with lenses disposed therebetween. It is often difficult to align all of the optical components to each other since a three dimensional alignment, in which these components are aligned in a Z-direction as well as X and Y directions, is typically required.

In addition, when moisture and/or other gases are allowed to enter a TOSA, they can damage the optical transmitting elements and/or other components enclosed therein. Since polymers are generally not gas hermetic, encapsulation may not be sufficient to provide effective hermiticity to keep out moisture and other gases.

SUMMARY OF THE INVENTION

One embodiment of the present invention includes a hermetically sealed TOSA for a VCSEL array. In another embodiment, a method of assembling a TOSA is provided. In this embodiment, alignment in the Z-direction between a fiber stub assembly (FSA) and a VCSEL array is performed substantially independently of alignment in the X-Y direction.

In an exemplary embodiment according to the present invention, an optical subassembly is provided. The optical subassembly comprises a ceramic substrate comprising at least one layer having an electrically conductive portion; a metallic plate mounted on the ceramic substrate, the metallic plate having a cavity disposed therethrough; at least one optoelectronic device mounted on the metallic plate proximate the cavity, wherein said at least one optoelectronic device is electrically coupled to the ceramic substrate though the cavity; a lens frame having a receptacle and at least one first alignment means; a lens assembly capable of being coupled to the receptacle, said lens assembly comprising a lens array including at least one lens optically aligned with said at least one optoelectronic device; an alignment plate having a cavity disposed therethrough and at least one second alignment means arranged for cooperatively engaging the first alignment means; and a retainer mounted on the alignment plate for retaining a fiber stub assembly.

Although described herein with respect to an exemplary TOSA, it will be appreciated by those of ordinary skill in the art that the principles disclosed herein may be applied to receiver optical subassemblies (ROSAs) as well.

BRIEF DESCRIPTION OF THE DRAWINGS

These and other aspects of the invention may be understood by reference to the following detailed description, taken in conjunction with the accompanying drawings, wherein:

FIG. 3 is a top view of a partially assembled TOSA illustrating a hermetically sealed VCSEL array in an exemplary embodiment according to the present invention;

FIG. 4 is a top view of a partially assembled TOSA of FIG. 3, further comprising a lens frame;

FIG. 5 is a top view of a partially assembled TOSA of FIG. 4, further comprising a lens assembly;

FIG. 6 is a top view of a partially assembled TOSA of FIG. 5, further comprising a weld plate;

DETAILED DESCRIPTION OF THE INVENTION

In an exemplary embodiment according to the present invention, an optical subassembly is hermetically sealed (for example, through laser welding and/or soldering) so as to prevent moisture and/or other gases from entering it and causing damages to optical components enclosed therein. Further, in order to reduce complexity associated with a three dimensional alignment between a fiber stub array and an array of optoelectronic devices during the assembly process of the optical subassembly, an alignment in X-Y direction is performed separately from an alignment in Z-direction. By separating the three dimensional alignment into two separate alignments, time and cost savings can be realized.

Figure 1:
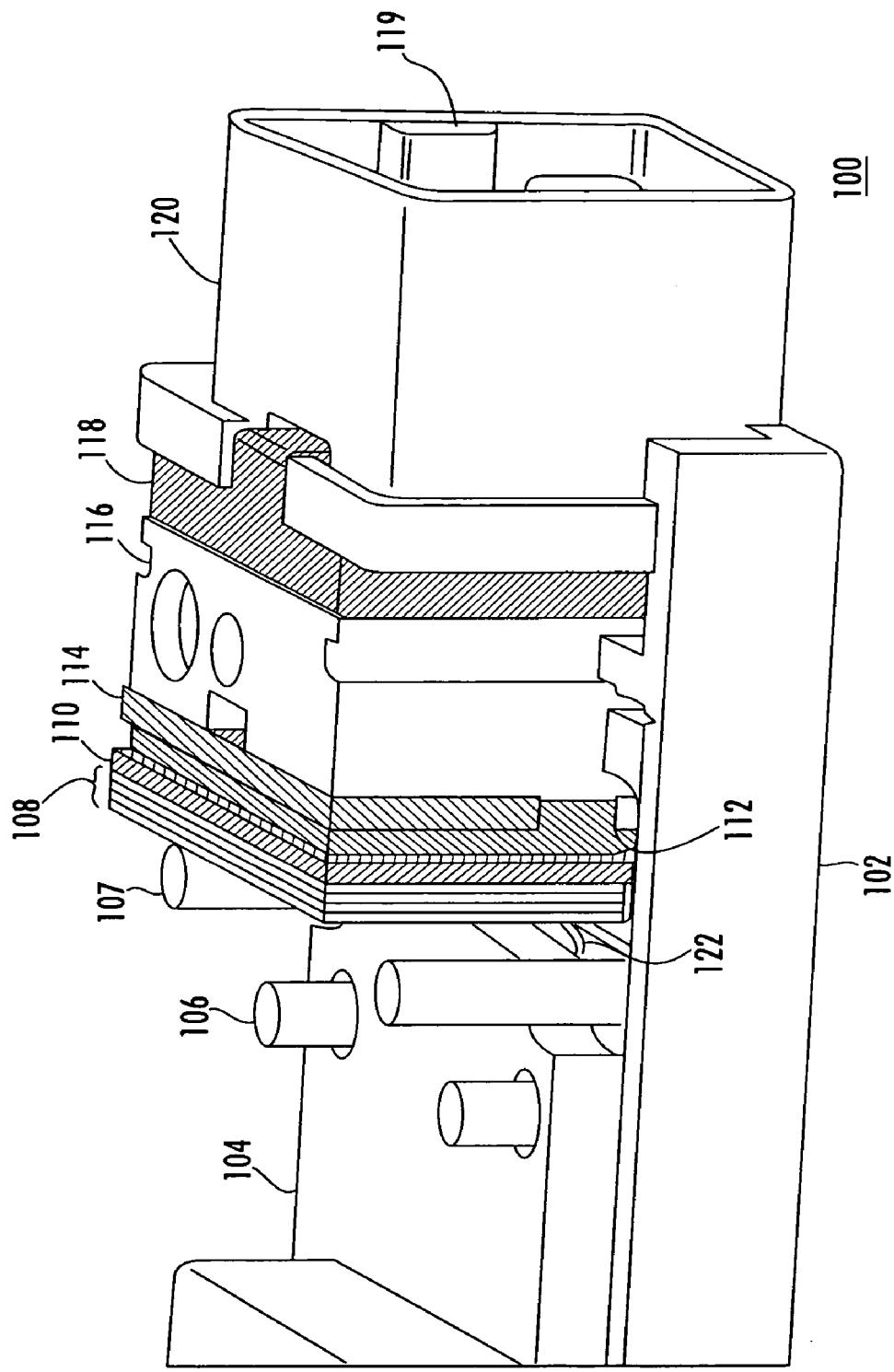
FIG. 1 is a perspective view of a TOSA illustrating certain components in an exemplary embodiment according to the present invention.

FIG. 1 is a perspective view of a TOSA 100 illustrating certain components in an exemplary embodiment according to the present invention. The TOSA 100 is mounted in an enclosure, here partially illustrated as a TOSA container 102, and electrically coupled to a printed circuit board (PCB) 104. The TOSA 100 also includes screws 107 for holding the TOSA container 102 together to enclose the components of the TOSA, and screws 106 for mounting the PCB 104 to the TOSA container 102. The TOSA may comprise an OC-48 TOSA that transmits data at 2.5 Giga bit per second (Gbps) per channel. The TOSA may also comprise an OC-192 TOSA or OC-768 TOSA, which transmit data at 10 Gbps and 40 Gbps, respectively, or other rates.

The PCB 104 is electrically connected to a ceramic substrate 108 via a flex connector 122. The ceramic substrate has multiple layers for routing electrical leads and for providing one or more ground planes. A metallic plate 110 is mounted on the ceramic substrate 108, through brazing, for example.

The metallic plate 110, which may be laser weldable, may be machined or metal-injection molded. In one embodiment, the metallic plate 110 is fabricated from Kovar®, which has a CTE (coefficient of thermal expansion) that is matched to the ceramic substrate 108. Kovar® is a registered trademark of CRS Holdings, Inc., Wilmington, Del. The metallic plate 110 may also be fabricated from other suitable laser weldable metal, such as, for example, stainless steel. In other embodiments, the metallic plate 110 may be referred to as a seal ring or as a weld ring. In addition to providing a laser weldable interface to the ceramic substrate 108, the metallic plate 110 may also function as a heat sink for the components of the TOSA.

Figure 2:
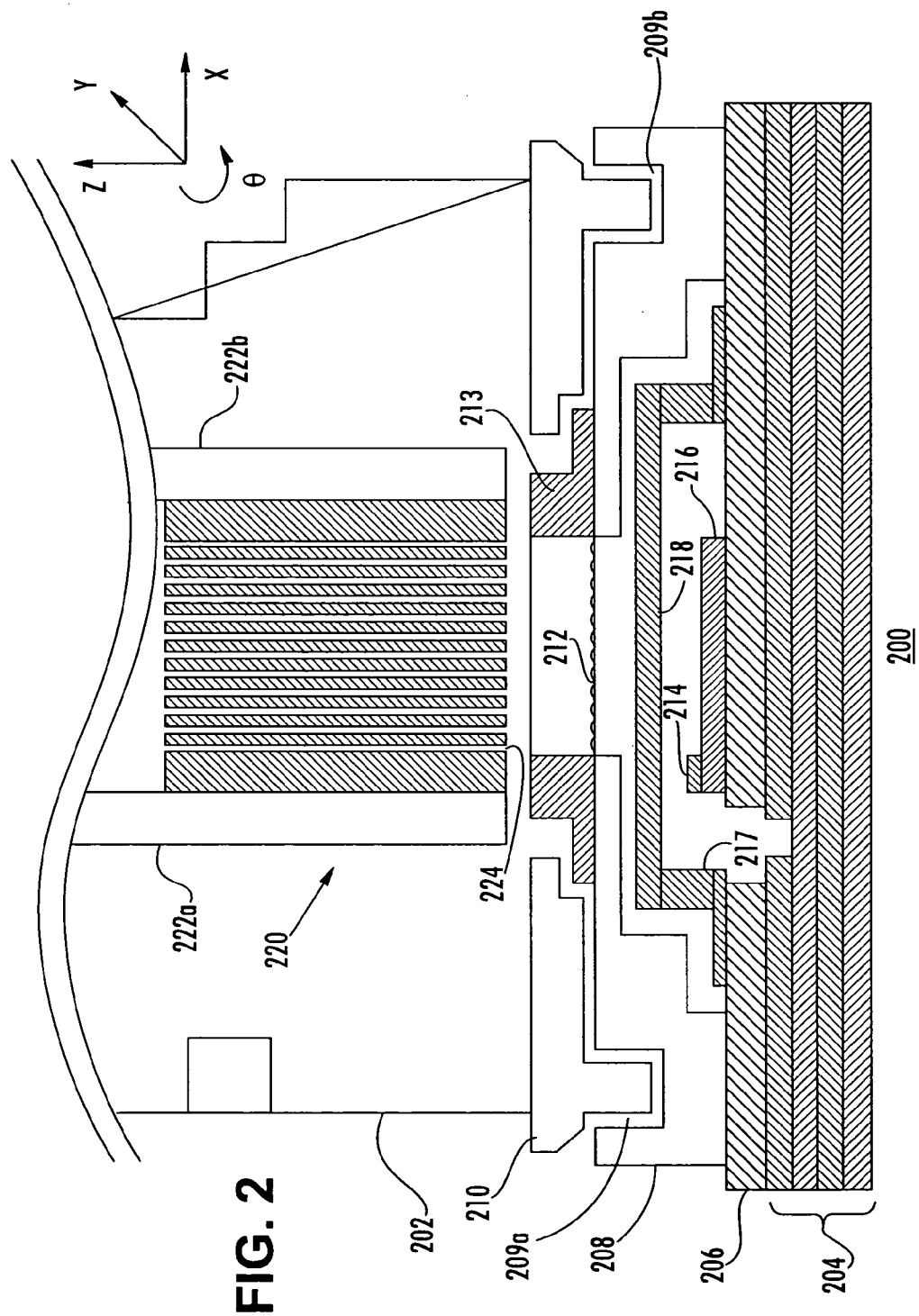
FIG. 2 is a cross-sectional view of a TOSA in an exemplary embodiment according to the present invention.

An array of optoelectronic devices (i.e., optical transmitting elements, such as a VCSEL array 216 of FIG. 2) is mounted on the metallic plate 110. The array of optoelectronic devices may comprise, e.g., long wave (LW) VCSELs. The metallic plate 110, for example, may have an opening (or cavity) formed therethrough for wire bonding or otherwise (e.g., flip-chip bonding) electrically coupling the optoelectronic devices to electrically conducting portions of the underlying ceramic substrate 108 for communication with other system components. The array of optoelectronic devices, for example, may be picked and placed on the metallic plate 110 during passive alignment with alignment marks on the ceramic substrate 108 or the metallic plate 110 using machine vision.

In an exemplary embodiment, the center-to-center distance between VCSELs in the array may be 250 $\mu$m. Thus, for example, with thirteen VCSELs in the array, the total length of the VCSEL array may be approximately 3 mm. Other dimensions used in the art also suffice. In other embodiments, a single VCSEL rather than a VCSEL array may be used for serial data transmission. In further embodiments, the optoelectronic devices may comprise short wave (SW) lasers.

The VCSEL array in the described embodiment is hermetically sealed using a glass lid transparent at the optical wavelength, such as a glass lid 218 of FIG. 2. The glass lid may be anti-reflection (AR) coated to allow the VCSEL output to pass through it more effectively. The glass lid may be any commercially available glass lid suitable for hermetic sealing.

A lens frame 112 is also mounted on the metallic plate 110. A lens assembly comprising a lens array (such as a lens array 212 of FIG. 2) may be mounted on the lens frame 112. The lens array should align with the VCSEL array to focus the VCSEL outputs onto corresponding fiber stubs of a fiber stub assembly (FSA), such as an FSA 220 of FIG. 2. The fiber stubs interface with fibers from a fiber/ferrule assembly to propagate VCSEL outputs over an optical transmission medium.

The lens array, for example, may comprise an optical grade glass, such as COSSO™ available from Geltech, Orlando, Fla., or any other commercially available, suitable lens array fabricated from glass, plastic or other suitable material. In other embodiments, the VCSEL array may be hermetically sealed by the lens array.

The TOSA 100 also includes a weld plate 114, which is held in place by a retainer 116. For example, the weld plate 114 may be laser welded or soldered to the retainer 116. The weld plate 114 may be laser welded to a lens frame 112 so that the VCSEL outputs are properly focused onto the fiber stubs of the FSA, which may be retained by the retainer 116. The weld plate may also be referred to as an alignment plate.

The FSA in the described embodiment contains short fiber stubs corresponding to and aligned with the VCSELs, and is used to interface the VCSELs with a fiber/ferrule assembly. In other embodiments, the fiber/ferrule assembly may interface (with or without a lens array) directly with the VCSELs without an FSA disposed therebetween.

The TOSA 100 also includes a plastic cap 118, which enables the TOSA to snap with the interfacing fiber/ferrule assembly. For example, the plastic cap 118 in the described embodiment includes snapping members 119 for holding the fiber/ferrule assembly in place. In addition, the TOSA 100 includes a nose receptacle 120, which may be spring loaded, and into which a fiber/ferrule assembly may be inserted during use.

FIG. 2 is a cross-sectional view of a TOSA 200 in an exemplary embodiment according to the present invention. FIG. 2, for example, may represent a cross-sectional view of the TOSA 100 in FIG. 1.

The TOSA 200 includes a retainer 202 for holding the optical components in place. The retainer holds the FSA 220 for interfacing with a fiber/ferrule assembly. The FSA 220 includes guide pins 222a and 222b for guiding the FSA 220 to mate properly with the fiber/ferrule assembly. The FSA 220 also includes embedded fiber stubs 224, which may be used to interface between a VCSEL/lens array and the fiber/ferrule assembly.

The TOSA 200 includes a multi-layered ceramic substrate 204, on which a laser weldable metallic plate 206 is mounted. The metallic plate 206, for example, may be fabricated from Kovar®. The metallic plate 206 may also be fabricated from stainless steel or any other suitable, laser weldable material. A VCSEL array 216 is mounted on the metallic plate 206.

The VCSEL array 216 may be fabricated from a suitable Group III-V system, Group II-VI system, or any other suitable material known to those skilled in the art. For example, the VCSEL array may be fabricated on a gallium arsenide (GaAs) or indium phosphate (InP) substrate, or any other suitable substrate material. The VCSEL array 216 in the described embodiment may include thirteen VCSELs fabricated thereon, although it will be appreciated that the present invention may be used with a single VCSEL or an array of VCSELs having a different number of lasers. The VCSEL array may also be referred to as a VCSEL die.

A monitor photodetector 214 is mounted on one of the VCSELs of the VCSEL array 216. Any one of the thirteen VCSELs, and not just the one at the edge, may be monitored by the monitor photodetector 214. In other embodiments, the VCSEL array 216 may include other number of VCSELs, e.g., nine, fabricated thereon, with one or more of the VCSELs being monitored by one or more photodetectors.

The monitor photodetector 214 may be a back-illuminated photodetector for detecting VCSEL output at its backside. Unlike most photodetectors that have contact pads and active area on the same side, the bond pads of the back-illuminated monitor photodetector 214 in the exemplary embodiment are on an opposite side of the active area on the backside. In this way, the monitor photodetector may be wire bonded or otherwise electrically coupled to the ceramic substrate in a similar manner as the VCSELs.

Even though the monitor photodetector is monitoring a VCSEL that is not being used to transmit data over the optical fiber, due to substantial similarities between operations of the VCSELs in a VCSEL array on a common substrate, and due to the fact that they all make good contacts with the heat conductive metallic plate 206, monitoring the spare VCSEL should provide sufficient information for feedback and automatic power control in the exemplary embodiment.

The VCSEL array 216 is enclosed in a lid assembly comprising a lid 218 and a lid frame 217. The lid 218 may be made of glass transparent at the optical wavelength of the VCSELs, and the lid frame 217 may be fabricated from laser weldable material, such as stainless steel or Kovar®. The lid 218 may be AR-coated to more effectively pass through VCSEL outputs. The lid frame 217 may be laser welded and/or soldered to the metallic plate 206. The hermetic sealing of the VCSEL array may be effected by applying solder, resistance or laser welding at the seam between the lid assembly and the metallic plate.

In other embodiments, the lid 218 may have a lens array formed thereon. In these embodiments, the hermetic seal would actually be formed by the lens array.

A lens frame 208 is also mounted on the metallic plate 206. The lens frame 208 may be fabricated from a laser-weldable material for welding to the metallic plate 206 and to a weld plate 114. For example, the lens frame may be fabricated from stainless steel, iron-copper alloy, iron-nickel alloy ("Alloy 52") or any other suitable material.

As illustrated on FIG. 2, the lens frame 208 has formed thereon a couple of grooves 209a and 209b. The grooves 209a and 209b may be used during alignment between the weld plate 210 and the lens frame 208. The grooves may also be referred to as notches or as alignment notches. In other embodiments, the lens frame 208 may have an O-ring groove formed on the bottom side opposite the side with the grooves 209a and 209b. The O-ring groove may be useful during solder-sealing of the lens frame 208 to the metallic plate 206, for example, for trapping excess flux or solder.

The lens frame 208 holds a lens assembly 213, which comprises a lens array 212. In one embodiment, the number of lenses in the lens array 212 is the same as the number of active VCSELs used to transmit data over the optical fibers. The lenses of the lens array should be aligned with the VCSELs of the VCSEL array 216.

As illustrated in FIG. 2, the weld plate 210 in the exemplary embodiment includes a couple of protruding portions that interface with the grooves 209a and 209b, respectively. The protruding portions may also be referred to as alignment members. It can also be seen in FIG. 2 that the edges of the weld plate 210 leading to the protruding portions are slanted at an angle. The angling of the edges may be useful to bring the edges of the weld plate proximately to the walls of the grooves 209a and 209b, respectively, for laser welding. In other embodiments, the lens frame 208 may have protruding portions (alignment members) and the weld plate 210 may have grooves (alignment notches), to facilitate alignment between the two.

The weld plate 210 is mounted (laser welded, soldered or otherwise attached) on the retainer 202, so that the weld plate 210, and therefore the lens frame 208 and other components, are substantially fixed in relation to the interfacing fiber/ferrule assembly once the assembly of the TOSA and interfacing between the TOSA and the fiber/ferrule assembly is completed.

FIG. 3 is a top view 300 of a partially assembled TOSA illustrating hermetic sealing of a VCSEL array 308 within a lid assembly 306. In the exemplary embodiment, the lid assembly 306 is laser welded, and then solder sealed onto a metallic plate 304, which in turn is mounted on a ceramic substrate 302. A monitor photodetector 310 is mounted on one of the VCSELs to monitor and provide feedback for automatic control of the VCSEL operation.

FIG. 4 is a top view 320 of a partially assembled TOSA illustrating a lens frame 312 in addition to the components illustrated in FIG. 3. The lens frame 312 may be laser welded to the metallic plate 304. The lens frame 312 has grooves 313a and 313b formed thereon. These grooves may be used for alignment during laser welding.

In the described exemplary embodiment, as can be seen in FIG. 4, the width of the lens frame is slightly less than the width of the underlying metallic plate 304, and the side walls of the lens frame 312 may form a 90° angle with respect to the top plane of the metallic plate 304. This way, when laser welding is applied between the metallic plate 304 and the lens frame 312, the forces applied to the seam are balanced. For example, the weld laser may be applied at 45° into that joint.

FIG. 5 is a top view 340 of a partially assembled TOSA illustrating a lens assembly 314 in addition to the components illustrated in FIG. 4. The lens assembly 314 comprises a lens array that should be aligned with the VCSEL array 308. The portion of the lens assembly 314 that holds the lens array may be fabricated from metal (e.g., stainless steel, iron-copper alloy or iron-nickel alloy), and may be laser welded and/or soldered to the lens frame 312.

FIG. 6 is a top view 360 of a partially assembled TOSA illustrating a weld plate 316 in addition to the components illustrated in FIG. 5. In this embodiment, the weld plate 316 is mounted on the lens frame 312. The weld plate 316 includes protruding portions 317a and 317b to interface with the grooves 313a and 313b, respectively, of the lens frame 312.

Figure 7:
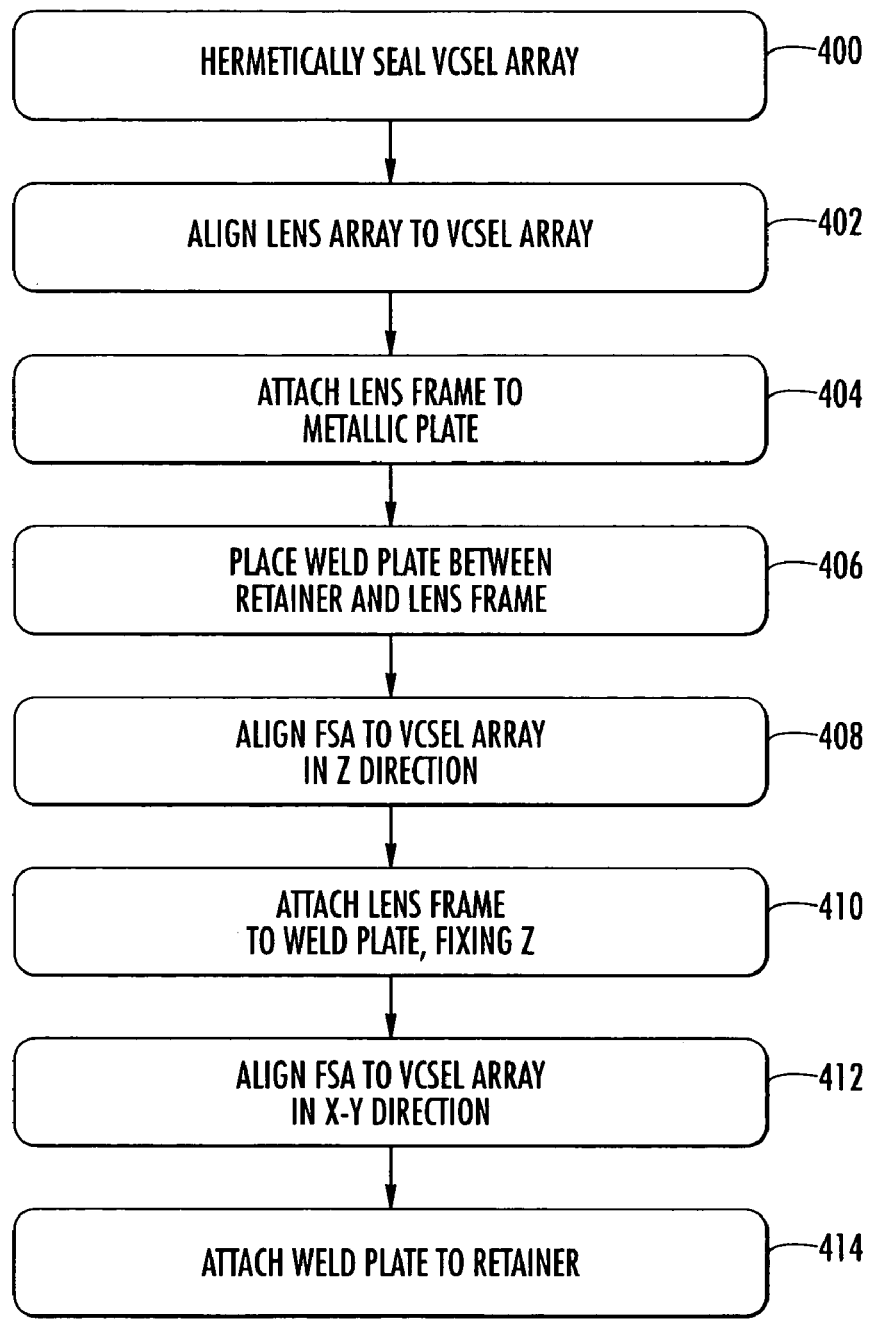
FIG. 7 is a flow diagram illustrating a process of assembling components of a TOSA in an exemplary embodiment according to the present invention.

FIG. 7 is a flow diagram illustrating a process of assembling the TOSA using laser welding in an exemplary embodiment according to the present invention. FIG. 7 may be best described in reference to FIGS. 2–6.

In step 400, the VCSEL array 308 is hermetically sealed by the lid assembly 306 as illustrated in FIG. 2. The lid assembly 306 may be laser welded and/or soldered to the metallic plate 306 to create the hermetic seal.

In step 402, the lens array is aligned to the VCSEL array in X-Y direction by adjusting the position of the lens frame 312 with respect to the metallic plate 304, on which the VCSEL array is fixedly mounted. The lens array may also be rotatably aligned (in a θ-direction indicated in FIG. 2) to the VCSEL array by rotating the lens assembly 314 with respect to the metallic plate 304. The alignment between the lens array and the VCSEL array, for example, may be realized through an active alignment, during which the VCSELS are activated (e.g., turned on or pumped up).

Upon achieving substantial alignment between the VCSEL array and the lens array, the lens frame 312 is laser welded to the metallic plate 304 using any suitable, commercially available laser welder. The lens frame 312 and the metallic plate 304 may be laser welded at multiple locations along the boundary between the two to generate a sufficiently strong bond. For example, the laser welder used may be a LW-4200™ laser welder available from Newport Corporation, Irvine, Calif.

In one embodiment, the laser welder used should be suitable for applying laser beams that exert opposing forces of equal magnitude to two opposing sides of objects being welded. This way, potential for misalignment between welded objects may be reduced. For example, two laser beams may be applied at junctions between the metallic plate 304 and the lens frame 312 on two opposing sides for laser welding.

As discussed above, the width of the lens frame 312 may be slightly less than the width of the metallic plate 304, so as to form a 90° angle at the laser welding joint on each side. For example, the laser beams may be applied at 45° at these joints to balance the forces exerted on them. In other embodiments, the lens frame 312 may be soldered to the metallic plate 304 rather than being laser welded. In still other embodiments, a combination of laser welding and soldering may be used.

After the lens frame 312 is fixedly attached to the metallic plate 304, a weld plate 316 is placed on top of the lens frame 312 in step 406. Further a retainer containing an FSA (e.g., the retainer 202 and the FSA 220 of FIG. 2) is placed on top of the weld plate 316. The weld plate 316 is not laser welded or otherwise attached to the retainer until the alignment in Z-direction is completed. During the alignment in the Z-direction, the weld plate 316 and the retainer are moved together in the Z-direction to adjust the focal point of the lenses on the fiber stubs of the FSA.

When the VCSELs are turned on, the lens array would focus the VCSEL outputs at a point in space. In step 408, the FSA is aligned to the VCSEL array (via the lens array) in the Z-direction (of FIG. 2) with the goal of optimizing the coupling efficiency (e.g., towards maximizing VCSEL outputs detected at the other end) between the VCSELs and the fiber stubs within the FSA. This may be referred to as an active alignment since at least one VCSEL output is detected and used during the alignment.

When the coupling efficiency between the VCSELs and the fiber stubs are substantially optimized, lower power may be used for transmission over the same distance with same probability of error (e.g., bit error rate (BER)) than with inefficient coupling. Thus, the VCSELs may operate at cooler temperature, and may result in longer operating life of the VCSELs.

As illustrated in FIG. 6, in the described exemplary embodiment, the protruding portions 317a and 317b of the weld plate slidably interface with the grooves 313a and 313b, respectively, of the lens frame 312. The distance between the weld plate 316 and the lens frame 312 in the Z direction are adjusted until the desirable coupling efficiency between the VCSEL array and the FSA is attained; then the weld plate 316 is laser welded to the lens frame 312 to fix the distance between the FSA and the VCSEL array in Z-direction.

Prior to welding the weld plate 316 to the lens frame 312, alignments other than the alignment in Z-direction may also be performed. For example, the weld plate 316 may be tilted in an X-Z plane about the Y-direction to correct any non-uniformity in the VCSEL output strength detected on the other side of the FSA. For example, if the surface of the FSA facing the VCSEL array is not parallel to the VCSEL array and is at even a slight angle, the fiber stub at one end of the FSA may detect lower-strength VCSEL output than the fiber stub at the other end, or vice versa, when in actuality, all the VCSEL outputs have equal intensity.

Therefore, by tilting the weld plate 316 in the X-Z plane, slight variations in distance between the VCSELs and the corresponding fiber stubs may be corrected. Further, the weld plate 316 may be tilted in Y-Z plane to correct reduction in coupling efficiency due to the VCSEL output hitting the fiber stubs at an angle.

Due to the fact that the edges of the weld plate 316 are slanted at an angle, slight tilting of the weld plate in X-Z plane with respect to the lens frame may not change the distance between weld plate and the lens frame at the welding spot. In this embodiment, this is desirable since the distance (i.e., gap) between two surfaces being laser welded should not be greater than 20 μm.

In other embodiments, the slanted edges of the weld plate 316 may be replaced by curved surfaces that are aligned with a curvature of a common cylinder that has a circular cross-section on the X-Z plane. This way, the weld plate may be tilted in X-Z plane with the both curved edges of the weld plate 316 touching the lens frame 312 over a range of tilting angles.

Once the distance between the FSA and the VCSEL array is substantially fixed in the Z-direction, in step 412 the FSA is aligned to the VCSEL array in an X-Y direction. The FSA may also be aligned to the VCSEL array in a θ-direction. In the described embodiment, the alignment in the X-Y direction may be an active alignment. Once the FSA is substantially aligned with the VCSEL array, the weld plate 316 is laser welded in step 414 to the retainer. In this embodiment, the laser welder may provide laser beams of equal power from two opposing sides to reduce potential for misalignment during laser welding. In other embodiments, the retainer and weld plate 316 may be attached to each other by soldering or any other suitable method known to those skilled in the art.

Figure 8:
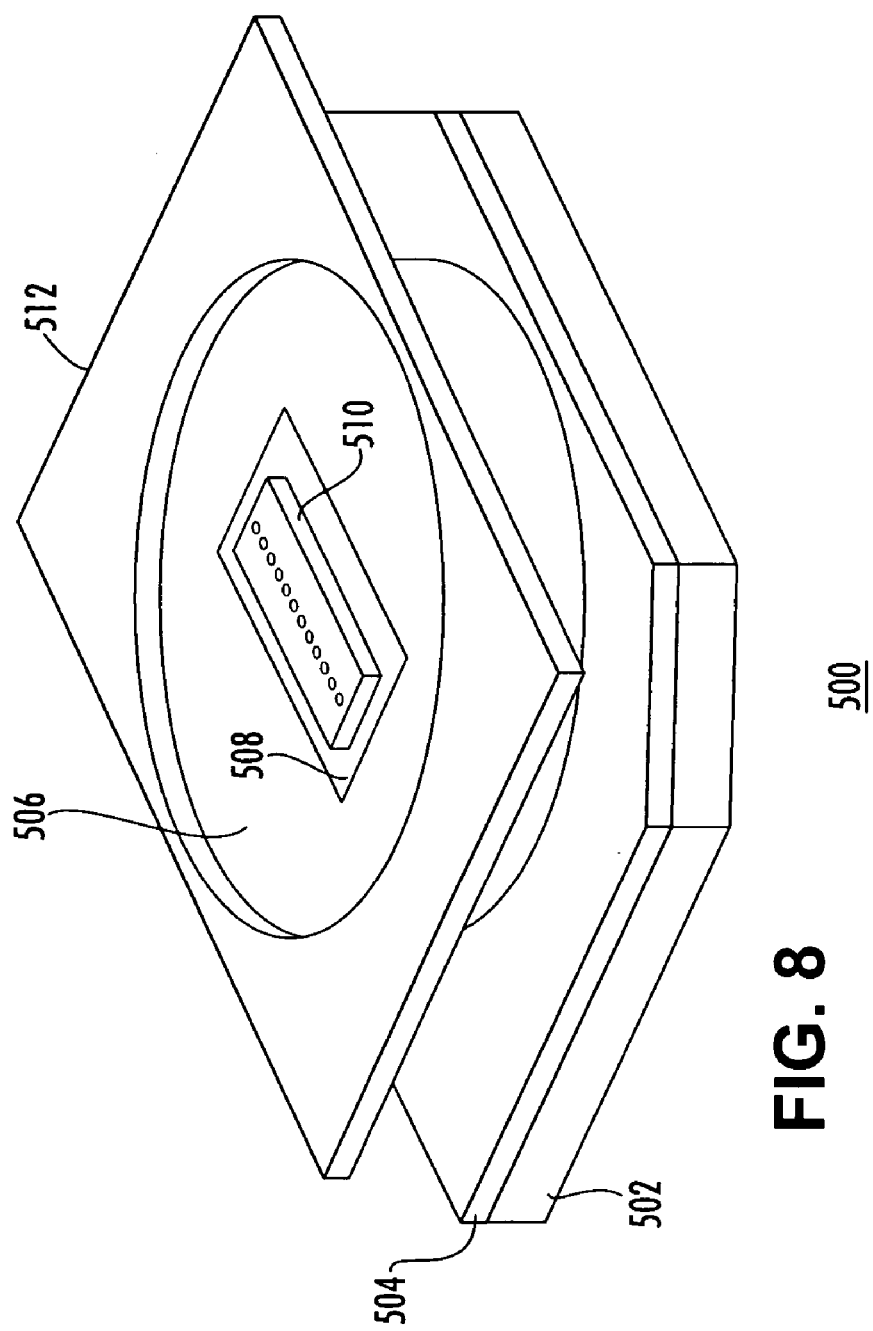
FIG. 8 is a perspective view of a subassembly of a TOSA illustrating certain components in another exemplary embodiment according to the present invention.

FIG. 8 is a perspective view of a subassembly 500 of a TOSA illustrating certain components in another exemplary embodiment according to the present invention. The subassembly 500 comprises a ceramic substrate 502, a metallic plate 504, a sealing container 506, a lens frame 508, a lens array 510 and a weld ring 512. The lens frame 508 and the lens array 510 together may be referred to as a lens assembly. The weld ring 512 may also be referred to as an alignment ring.

The lens array 510, and therefore an underlying VCSEL array is mounted substantially at the center of the sealing container 506, with one of the VCSELs positioned on the center axis of the sealing container 506. This way, regardless of the orientation of the sealing container 506 with respect to the weld ring 512, a VCSEL is always aligned with the center axis of the weld ring 512.

Figure 9:
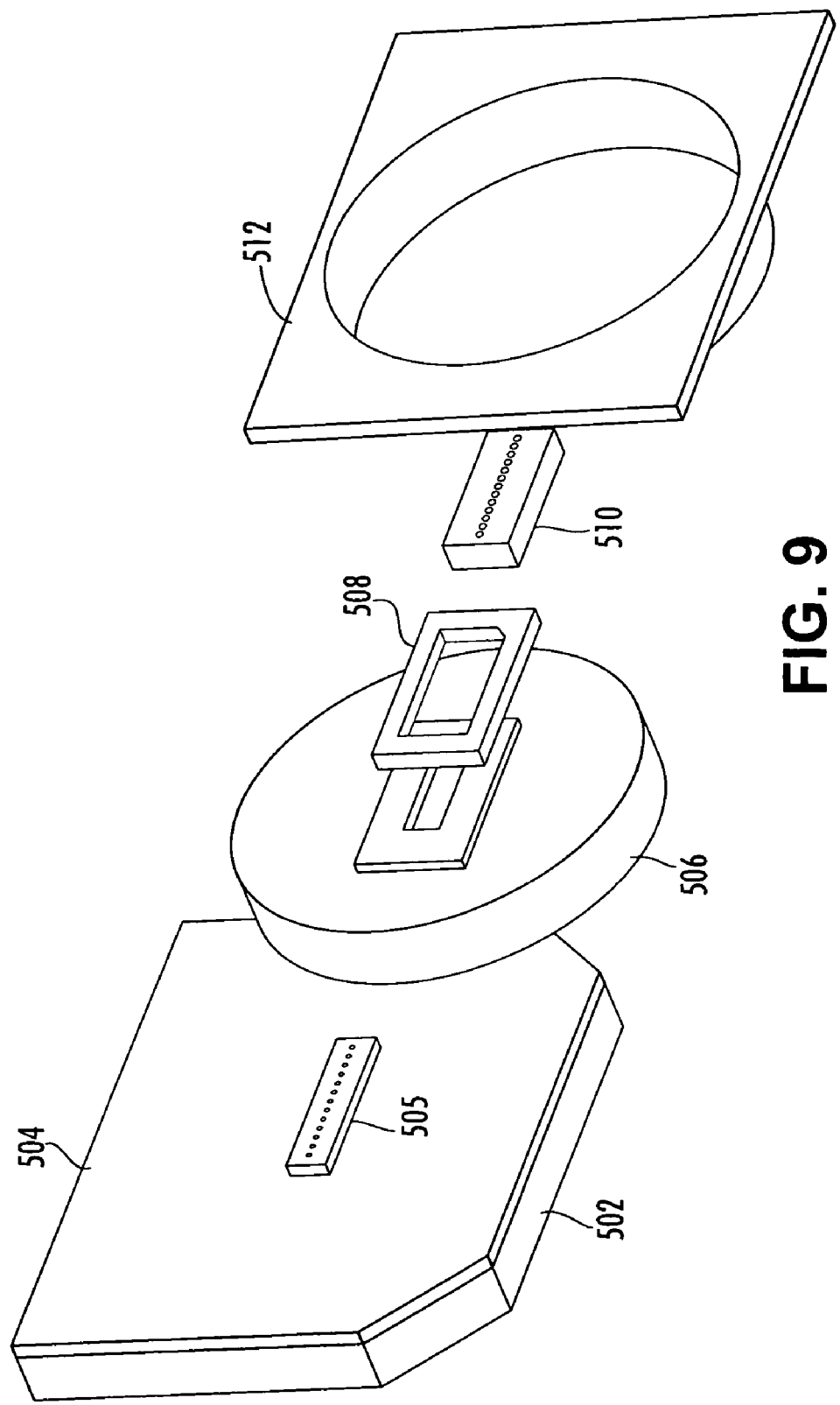
FIG. 9 is an exploded view of the subassembly of FIG. 8.

FIG. 9 is an exploded view of the subassembly 500 of FIG. 8. A VCSEL array 505 is mounted on the metallic plate 504, which may be made from a laser weldable material, such as, for example, Kovar® or stainless steel. The sealing container 506 is also made of a laser weldable material in this exemplary embodiment.

The VCSEL array 505 in this exemplary embodiment, which may have an array of nine, thirteen, or any other desired number of VCSELs, is hermetically sealed using the sealing container 506, the lens frame 508 and the lens array 510. The hermetic sealing may be achieved by laser welding, soldering, combination of the two, or any other sealing method known to those skilled in the art. The glass lens array 510 can be hermetically mounted to the sealing container 506 by means of lens frame 508. The lens frame 508 can be in form of a metal frame that is seam welded to the container, or it can be in form of a glass frit or solder ring that hermetically seals the lens array 510 to the container 506.

Figure 10:
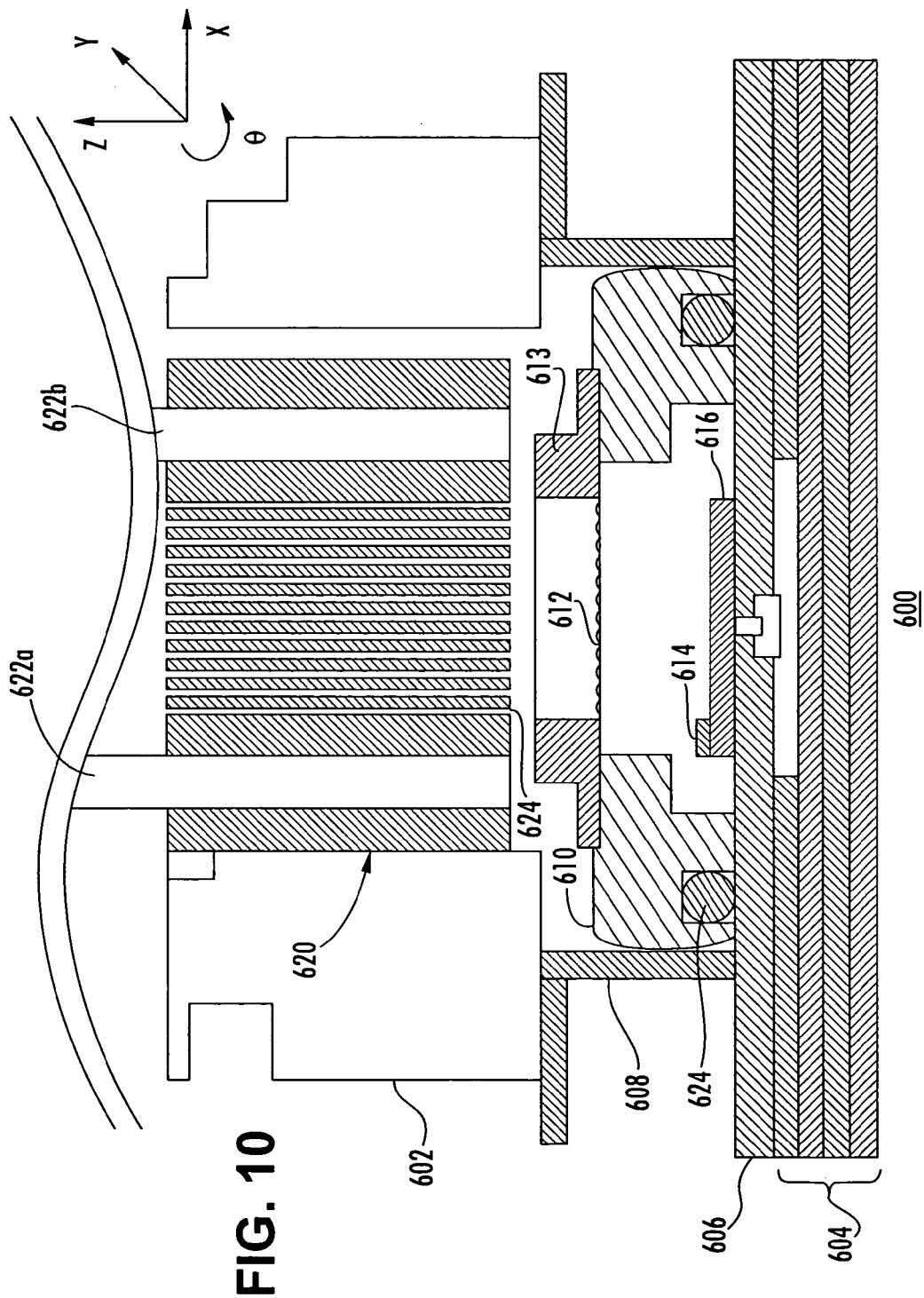
FIG. 10 is a cross-sectional view of the TOSA including the subassembly of FIG. 8.

FIG. 10 is a cross-sectional view of a TOSA 600 in an exemplary embodiment according to the present invention. FIG. 10, for example, may include the subassembly 500 of FIG. 8.

The TOSA 600 includes a retainer 602 for holding the optical components in place. The retainer holds the FSA 620 for interfacing with a fiber/ferrule assembly. The FSA 620 includes guide pins 622a and 622b for guiding the FSA 620 to mate properly with the fiber/ferrule assembly. The FSA 620 also includes embedded fiber stubs 624, which may be used to interface between a VCSEL/lens array and the fiber/ferrule assembly.

The TOSA 600 includes a multi-layered ceramic substrate 604, on which a laser weldable metallic plate 606 is mounted. The metallic plate 606, for example, may be fabricated from Kovar®. The metallic plate 606 may also be fabricated from stainless steel or any other suitable, laser weldable material. A VCSEL array 616 is mounted on the metallic plate 606.

A monitor photodetector 614 is mounted on one of the VCSELs of the VCSEL array 216. Any one of the VCSELs in the array may be monitored by the monitor photodetector 614. The monitor photodetector 614 may be a back-illuminated photodetector for detecting VCSEL output at its backside.

In this exemplary embodiment, the VCSEL array 616 is hermetically sealed within a sealing container 610, a lens array 612 and a lens frame 613. The sealing between the sealing container and the metallic plate 606 is achieved through soldering, laser welding and/or any other suitable method known to those skilled in the art. Prior to being fixedly attached to the metallic plate 606, the sealing container may be rotatably aligned about the center of the VCSEL array on ball bearings 624, for example.

In one embodiment, the number of lenses in the lens array 612 is the same as the number of active VCSELs used to transmit data over the optical fibers. The lenses of the lens array 612 should be aligned with the VCSELs of the VCSEL array 616.

The weld ring 608 is mounted (laser welded, soldered or otherwise attached) on the retainer 602, so that the weld ring 608, and therefore the sealing container 610 and other components, are substantially fixed in relation to the interfacing fiber/ferrule assembly once the assembly of the TOSA and interfacing between the TOSA and the fiber/ferrule assembly is completed.

Figure 11:
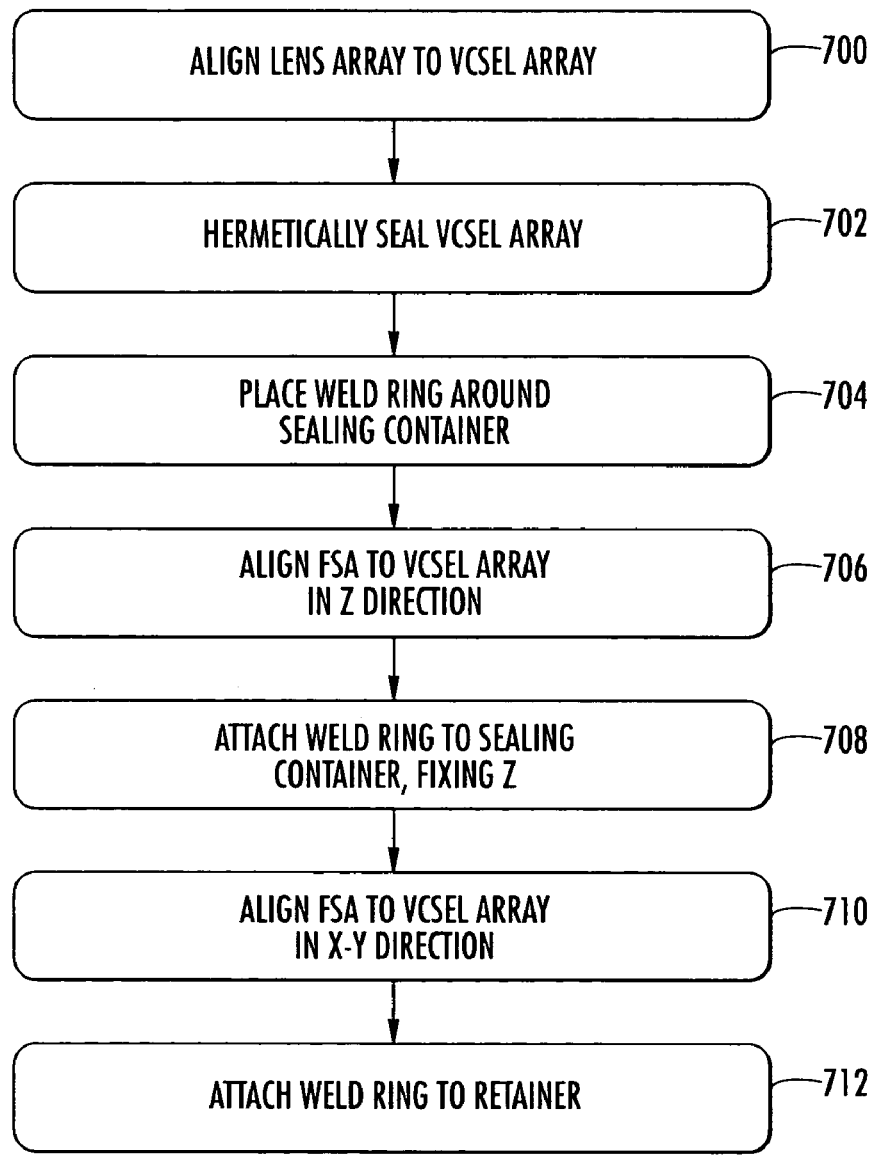
FIG. 11 is a flow diagram illustrating a process of assembling the TOSA of FIG. 10.

FIG. 11 is a flow diagram illustrating a process of assembling the TOSA using laser welding in an exemplary embodiment according to the present invention. FIG. 11 may be best described in reference to FIGS. 10.

In step 700, the lens array 612 is aligned with the VCSEL array 616. During this process, the sealing container 610 may be rotated about the VCSEL array. Once the lens array 612 is substantially aligned with the VCSEL array 616, the sealing container is fixedly attached to the metallic plate 606. Then in step 702, the VCSEL array 616 is hermetically sealed.

The fixedly attaching and hermetic sealing between the sealing container 610 and the metallic plate 606 may be achieved by laser welding, soldering and/or any other suitable hermetic sealing method. Since the sealing container 610 has generally cylindrical shape, forces with substantially the same magnitude exerted by the welding laser beams should be applied substantially simultaneously at three locations, 120 degrees apart from each other. The laser welding, for example, may be performed using a LW4000™ laser welder available from Newport Corporation, Irvine, Calif., or any other suitable, commercially available laser welder.

In step 704, the weld ring 608 is placed around the sealing container 610, and the retainer 602 is placed on the weld ring 608. Then in step 706, the retainer 602 and the weld ring 608 are held together and aligned with the VCSEL/lens assembly in the Z-direction towards maximizing the output power of the VCSELs detected through the FSA 620. This may be referred to as an active alignment since at least one VCSEL output is detected and used during the alignment.

Since one of the VCSELs is aligned with the center axis of the weld ring 608, it may suffice to try to optimize the detected output from such center-aligned VCSEL. This alignment used in the described embodiment may be referred to as an active alignment where one or more VCSELs are turned on, and at least one VCSEL output is detected and used during alignment.

In the described exemplary embodiment, the alignment in Z-direction between the VCSEL array 616 and the FSA 620 may involve Z-direction movement of the weld ring 608 and the retainer 602 with respect to the VCSEL array. The alignment in Z-direction may also involve tilting the weld ring 608 with respect to the sealing container 610. By designing the sealing container 610 to have a shape of a center section of a sphere rather than a section of a cylinder, as illustrated in FIG. 10, the sealing container 610 may have a curvature over which the weld ring 608 may tilt in any direction over a range of angles.

Once a satisfactory alignment is achieved between the FSA and the VCSEL array in the Z-direction, in step 708 the weld ring is laser welded to the sealing container by applying laser beams having substantially the same power from three directions that are 120 degrees apart from each other. The laser beams may be applied on the outer surface of the weld ring 608 to weld to the sealing container 610 inside the weld ring, since the laser beams can typically weld through metal.

In step 710, the retainer 602, and therefore the FSA 620 is aligned with the VCSEL/lens array in an X-Y direction. The FSA may be aligned with the VCSEL/lens array in a θ-direction as well. In the described embodiment, the alignment in the X-Y direction may be an active alignment. Once a satisfactory alignment is achieved, the weld ring 608 is laser welded to the retainer 602 to fix the alignment. Since the retainer and the weld ring have rectangular surfaces at their interface, the laser welding may be achieved by applying laser beams having power with substantially the same magnitude from two opposing directions. The weld ring 608 may also be attached to the retainer 602 by soldering or any other suitable method known to those skilled in the art.

Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents.

For example, even though the present invention has been described in reference to TOSAs comprising VCSELs, the principles of the present invention may also be applied to TOSAs comprising edge emitting lasers. When the edge emitting lasers are used, for example, the laser substrates would be oriented differently so as to align the emitting edges with an FSA or a fiber/ferrule assembly.

What is claimed is:

1. A method for making an optical subassembly, comprising:
    mounting an array of optoelectronic devices to a metallic plate;
    aligning a lens frame containing a lens array in at least the X and Y direction with respect to the array of optoelectronic devices; and fixing the lens frame to the metallic plate, wherein the array of optoelectronic devices is hermetically sealed by the lens array.

2. The method of claim 1, further comprising the step of rotating the lens frame with respect to the metallic plate to align the lens array to the optoelectronic device array in the theta direction.

3. The method of claim 1, wherein the step of fixing the lens frame to the metallic plate comprises laser welding the lens frame to the metallic plate while maintaining alignment between the lens array and the optoelectronic device array.

4. A method for making an optical subassembly, comprising:
   mounting an array of optoelectronis devices to a metallic plate;
   aligning a lens frame containing a lens array in at least the X and Y direction with respect to the array of optoelectronic devices;
   fixing the lens frame to the metallic plate, wherein the array of optoelectronic devices is hermetically sealed;
   placing a retainer on a weld plate, said retainer containing a fiber stub array (FSA) comprising at least one fiber stub;
   aligning the weld plate to the lens frame in at least the Z-direction to provide optical coupling between the array of optoeletronic devices and the fiber stub array; and
   fixing the weld plate to the lens frame.

5. The method of claim 4, wherein the step of aligning the weld plate to the lens frame in at least the Z-direction comprises an active alignment.

6. The method of claim 4, wherein the step of fixing the weld plate to the lens frame comprises laser welding.

7. The method of claim 4, further comprising the steps of aligning the retainer to the weld plate in at least the X-Y direction after fixing the weld plate to the lens frame; and fixing the retainer to the weld plate, whereby the fiber stub array in the retainer is aligned with the lens array.

8. The method of claim 7, wherein the step of fixing the retainer to the weld plate comprises laser welding.

9. The method of claim 4, further comprising the steps of roughly pre-aligning the fiber stub array to the array of optoelectronic devices prior to aligning the weld plate to the lens frame in at least the Z-direction.

\* \* \* \* \*